(12) United States Patent
Beaman et al.

(10) Patent No.: US 6,525,551 B1
(45) Date of Patent: *Feb. 25, 2003

(54) PROBE STRUCTURES FOR TESTING ELECTRICAL INTERCONNECTIONS TO INTEGRATED CIRCUIT ELECTRONIC DEVICES

(75) Inventors: Brian Samuel Beaman, Apex, NC (US); Keith Edward Fogel, Mohegan Lake, NY (US); Paul Alfred Lauro, Nanuet, NY (US); Eugene John O'Sullivan, Nyack, NY (US); Da-Yuan Shih, Poughkeepsie, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/081,342

(22) Filed: May 19, 1998

Related U.S. Application Data (60) Provisional application No. 60/047,556, filed on May 22, 1997.

(51) Int. Cl.[7] .............................................. G01R 31/02
(52) U.S. Cl. ...................................... 324/754; 324/761
(58) Field of Search ................................ 324/754, 755, 324/761, 762; 439/66, 91, 71, 72; 29/850; 228/180.5

(56) References Cited

U.S. PATENT DOCUMENTS

| | | | | |
|---|---|---|---|---|
| 3,795,037 A | * | 3/1974 | Luttmer | 29/628 |
| 4,295,700 A | * | 10/1981 | Sado | 439/91 |
| 4,793,814 A | * | 12/1988 | Zifcak et al. | 439/66 |
| 5,476,211 A | * | 12/1995 | Khandris | 228/180.5 |
| 5,531,022 A | * | 7/1996 | Beaman et al. | 29/850 |

* cited by examiner

Primary Examiner—Vinh P. Nguyen
(74) Attorney, Agent, or Firm—Thomas A. Beck; Daniel P. Morris, Esq.

(57) ABSTRACT

A probe structure for probing an electronic device. The probe has: a substrate having a substrate surface having a plurality of substrate electrical contact locations; a plurality of elongated electrical conductors having a first and second end; the first end of each of the plurality of elongated electrical conductors is electrically connected to one of the plurality of substrate electrical contact locations; a plate having a first and second side, and having a plurality of openings therein extending from the first side to the second side; the plate is disposed so that the first side thereof faces sad substrate; the second end of each of the plurality of elongated electrical conductors extends through one of the openings in the plate; a support for maintaining the plate at a distance from the substrate surface; the distance is selected so that the second ends project out from the second side of the plate a sufficient amount so that when the probe structure is pressed against a device under test the second ends of the elongated electrical conductors are maintained within a displacement from an original position by the opening so that the second ends of the elongated electrical conductors remain in contact with an electrical contact location on the device under test.

8 Claims, 12 Drawing Sheets

PROBE STRUCTURES FOR TESTING ELECTRICAL INTERCONNECTIONS TO INTEGRATED CIRCUIT ELECTRONIC DEVICES

This application claims priority from Provisional Application Serial No. 60/047,556 filed on May 22, 1997.

FIELD OF THE INVENTION

The present invention is directed to probe structures for testing of electrical interconnections to integrated circuit devices and other electronic components.

BACKGROUND OF THE INVENTION

Integrated circuit (IC) devices and other electronic components are normally tested to verify the electrical function of the device and certain devices require high temperature burn-in testing to accelerate early life failures of these devices. The interconnection methods used to test IC devices with aluminum bond pads include permanent and disconnectable techniques. The permanent techniques that are typically used include wire bonding to provide a connection from the IC device to a substrate with fan out wiring or a metal lead frame package. The disconnectable techniques include rigid and flexible probes that are used to connect the IC device to a substrate with fan out wiring or directly to the test equipment.

The permanent attachment techniques used for testing integrated circuit devices such as wire bonding to a leadframe of a plastic leaded chip carrier are typically used for devices that have low number of interconnections and the plastic leaded chip carrier package is relatively inexpensive. The device is tested through the wire bonds and leads of the plastic leaded chip carrier and plugged into a test socket. If the integrated circuit device is defective, the device and the plastic leaded chip carrier are discarded.

The most cost effective techniques for testing and burn-in of integrated circuit devices provide a direct interconnection between the aluminum bond pads on the device to a disconnectable probe sockets that is hard wired to the test equipment. Contemporary probes for testing integrated circuits are expensive to fabricate and are easily damaged. The individual probes are typically attached to ring shaped printed circuit board and support cantilevered metal wires extending towards the center of the opening in the circuit board. Each probe wire must be aligned to a contact location on the integrated circuit device to be tested. The probe wires are generally fragile and easily deformed or damaged. This type of probe fixture is typically used for testing integrated circuit devices that have aluminum bond pads along the perimeter of the device. This type of probe cannot be used for testing integrated circuit devices that have high density area array bond pads.

Another technique used for testing IC devices comprises a thin flex circuit with metal bumps and fan out wiring. The bumps are typically formed by photolithographic processes and provide a raised contact for the probe assembly. The bumps are used to contact the flat or recessed aluminum bond pads on the IC device. An elastomer pad is typically used between the back of the flex circuit and a pressure plate or rigid circuit board to provide compliance for the probe interface. This type of probe is limited to flexible film substrate materials that typically have one or two wiring layers.

The size and spacing of the bond pads on IC devices is limited by the minimum size ball bond used for wire bonded devices and the minimum size solder ball used for flip chip devices. On going process and equipment improvements in the industry have provided the capability for consistent formation of smaller ball bonds and smaller solder balls. These improvements in turn allow for smaller bond pads and tighter spacing between bond pads. Bond pad size and spacing on IC devices is also limited by the probe fixture geometry, the probe position tolerance, and probe movement such as wiping or scrubbing action.

As geometries become smaller, the probes become more fragile and easily damaged. Obvious physical damage to a probe fixture can usually be repaired or replaced at a cost. Physical damage that is not obvious can cause the probe fixture to malfunction and potentially damage the IC wafer. Optical inspection of a probe fixture is often necessary to detect problems of this nature.

Probe position accuracy can be optimized by controlling probe formation tolerances and probe placement tolerances. Even with the best probe forming and positioning techniques available today, probe position accuracy can be further effected by residual material stresses, and thermal expansion mismatches. These problems are much more difficult to control and optimize. Probe movement is typically used as a means of penetrating the thin oxide layer found on aluminum bond pads. Probes can be designed to create a wiping or scrubbing action against the surface of the bond pad to scrape through the oxide and make contact with the metal pad. The wiping or scrubbing action is also useful to move tiny dust particles out of the contact interface area. An alternate means of penetrating the thin oxide layer can be realized using a piercing action with multiple pointed contacts. Various techniques such as dendritic plating or plasma arc spraying are available for treating the contact surface of the probes.

SUMMARY OF THE INVENTION

It is the object of the present invention to provide a probe for testing integrated circuit devices.

Another object of the present invention is to provide a probe that is an integral part of the fan out wiring on the test substrate or other printed wiring means to minimize the contact resistance of the probe interface.

A further object of the present invention is to provide a probe that has a raised tip to contact recessed surfaces.

An additional object of the present invention is to provide a probe structure that has an enhanced true position tolerance.

Yet another object of the present invention is to provide a probe structure that has high durability.

Yet a further object of the present invention is to provide a means of preventing plastic deformation in the probe wires.

It is another object of the present invention to provide an apparatus for making electrical contact with a plurality of bond pads on an integrated circuit device comprising: a first fan out substrate having a first surface; the first surface having a plurality of contact locations; a plurality of ball bonds attached to the plurality of contact locations; a plurality of wires extending outward from the ball bonds, away from the first surface on fan out substrate; a metal coating formed on the plurality of wires.

It is another object of the present invention to provide an apparatus wherein the fan out substrate type includes but is not limited to the following: multilayer ceramic substrates with thick film wiring multilayer ceramic substrates with thin film wiring metalized ceramic substrates with thin film wiring epoxy glass laminate substrates with copper wiring silicon substrates with thin film wiring It is another object of the present invention to provide an apparatus further including a preformed frame or spacer surrounding clusters, groupings, or arrays of the probes.

It is another object of the present invention to provide an apparatus further including a sheet of material having a plurality of holes corresponding to the plurality of probe wires.

It is another object of the present invention to provide an apparatus further including a surface topology on the ends of the plurality of probes wires comprised of a plurality of sharp, pointed projections.

It is another object of the present invention to provide an apparatus further including a plurality of ball shaped contacts on the ends of the plurality of wires.

It is another object of the present invention to provide an apparatus further including a preformed frame or spacer surrounding clusters, groupings, or arrays of the probes.

It is another object of the present invention to provide an apparatus further including a sheet of material having a plurality of holes corresponding to the plurality of probe wires.

It is another object of the present invention to provide an apparatus further including a surface topology on the ends of the plurality of probes wires comprised of a plurality of sharp, pointed projections.

Yet an additional object of the present invention is to provide a means of enhancing the surface finish of the probe tip for penetration of thin oxide layers on the mating contact surface.

A broad aspect of the present invention is a probe structure comprising: a substrate having a substrate surface having a plurality of substrate electrical contact locations; a plurality of elongated electrical conductors having a first and second end; the first end of each of the plurality of elongated electrical conductors is electrically connected to one of the plurality of substrate electrical contact locations; a plate having a first and second side conveniently having a first electrically conducting layer and a second dielectric layer, and having a plurality of openings therein extending from the first side to the second side; the plate is disposed so that the first side thereof faces said substrate; the second end of each of the plurality of elongated electrical conductors extends through one of the openings in the plate; a support conveniently in the form of a ring of elastomeric material for maintaining the plate at a distance from the substrate surface; the distance is selected so that the second ends project out from the second side of the plate a sufficient amount so that when the probe structure is pressed against a device under test the second ends of the elongated electrical conductors are maintained within a displacement from an original position by the opening so that the second ends of the elongated electrical conductors remain in contact with an electrical contact location on the device under test.

BRIEF DESCRIPTION OF THE DRAWINGS

These and other objects, features, and advantages of the present invention will become apparent upon further consideration of the following detailed description of the invention when read in conjunction with the drawing figures, in which.

DETAILED DESCRIPTION OF THE INVENTION

Preferred Embodiment

Figure 1:
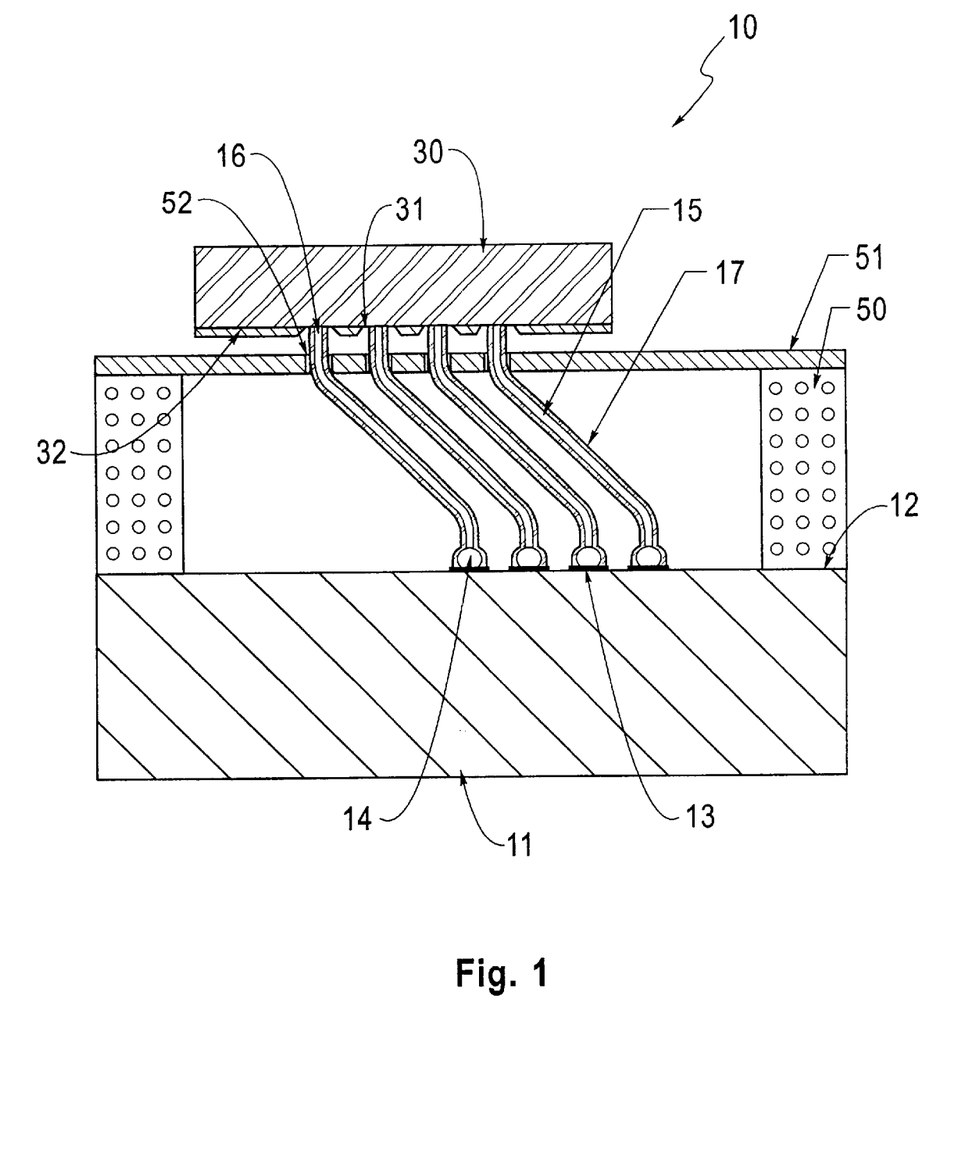
FIG. 1 shows a cross section of a high density test probe attached to a substrate and pressed against the aluminum bond pads on an integrated circuit device.

FIG. 1 shows a cross section of a test substrate (11) and high density probe (10) according to the present invention. The test substrate (11) provides a rigid base for attachment of the probes (10) and fan out wiring from the high density array of probe contacts to a larger grid of pins or other interconnection means to the equipment used to electrically test the integrated circuit device. The fan out substrate can be made from various materials and constructions including single and multi-layer ceramic with thick or thin film wiring, silicon wafer with thin film wiring, or epoxy glass laminate construction with high density copper wiring. The high density probes (10) are attached to the first surface (12) of the substrate (11). The probes are used to contact the aluminum bond pads (31) on the integrated circuit device (30). The aluminum bond pads (31) are typically recessed slightly below the surface of the passivation layer (32) of the integrated circuit device (30). The high density probe (10) is attached directly to the fan out wiring (13) on the first surface (12) of the substrate (11) to minimize the resistance of the probe interface. The elasticity or compliance of the probe wire is controlled by the combined modulus of elasticity for the wire (15) and the plating (16) on the surface of the wire (15). As the high density probe (10) is pressed against the IC device (20), the end of the probe (19) is deflected in X, Y, and Z directions. The alignment mask (51) limits the movement of the probe end (16) in the X and Y directions by the size of the holes (52) in the alignment mask (51). Movement of the probe end (16) in the Z direction is limited by the length of the probe end (16) protruding through the alignment mask (51). The height of the alignment mask (51) above the first surface (12) of the substrate (11) is controlled by the thickness of the support frame (50). Limiting the movement of the probe end (16) in the Z direction is essential to prevent plastic deformation of the probe wires pressed against the IC device (20), the end of the probe (19) is deflected in X, Y and Z directions. The alignment mask (51) limits the movement of the probe end (16) in the X, Y and Z directions by the size of the holes (52) in the alignment mask (51). Movement of the probe end (16) in the Z direction is limited by the length of the probe end (16) protruding through the alignment mask (51). The height of the alignment mask (51) above the first surface (12) of the substrate (11) is controlled by the thickness of the support frame (50). The support frame (50) is made of a ring of elastomeric material. Support frame (50) is compliant and is used to support plate (51) (which is an alignment mask layer) and is used to control the probe height. Limiting the movement of the probe end (16) in the Z direction is essential to prevent plastic deformation of the probe wires pressed against the IC device (20), the end of the robe (19) is deflected in X, Y and Z directions. The alignment mask (51) limits the movements of the probe end (16) in the X, Y and Z directions by the size of the holes (52) in the alignment mask (51). Movement of the probe end (16) in the Z direction is limited by the length of the probe end (16) protruding through the alignment mask (51). The height of the alignment mask (51) above the first surface (12) of the substrate (11) is controlled by the thickness of the support frame (50). The support frame (50) is made of a ring of elastomeric material. Support frame (50) is compliant and is used to support plate (51) (which is an alignment mask layer) and is used to control the probe height. Limiting the movement of the probe end (16) in the Z direction is essential to prevent plastic deformation of the probe wires.

Figure 2:
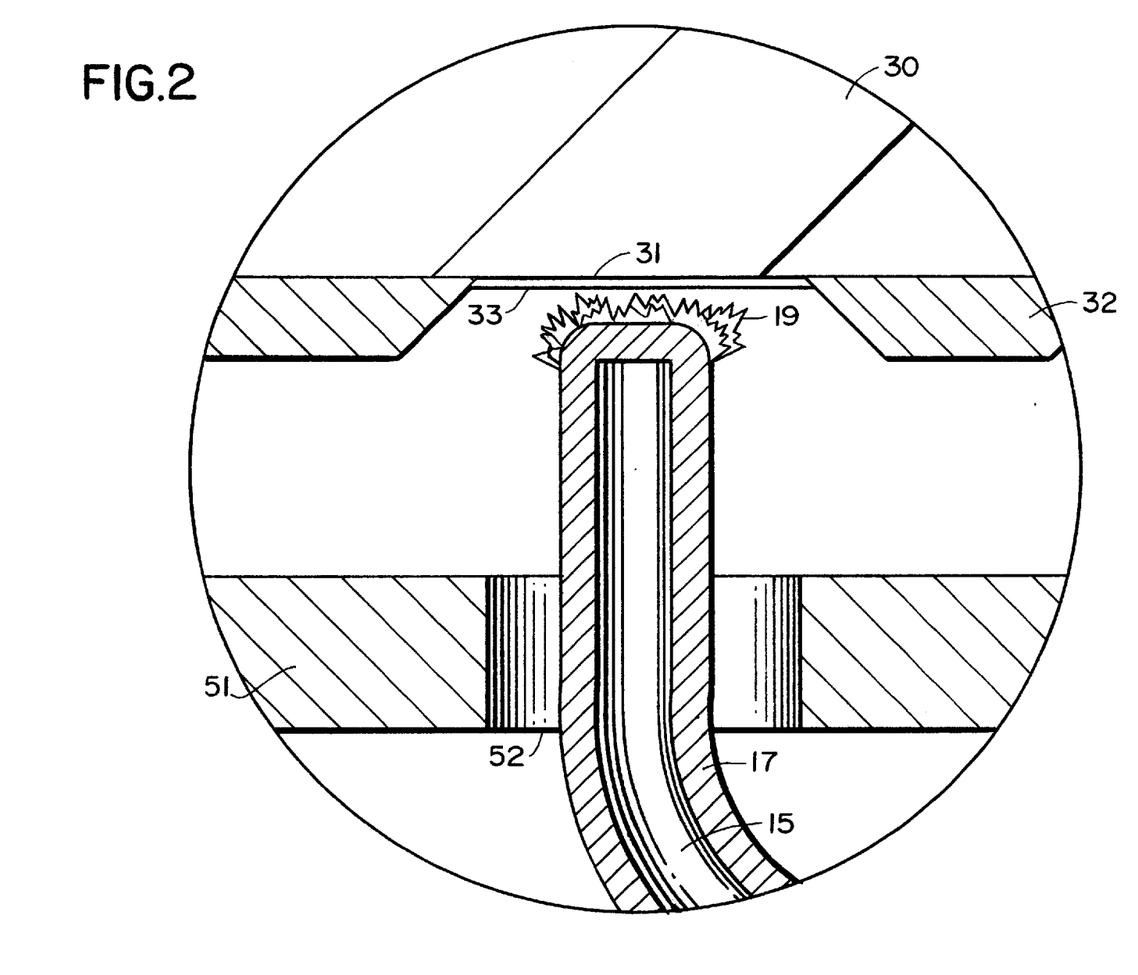
FIG. 2 shows a magnified view of the probe tip and the surface finish treatment.

FIG. 2 shows a magnified view of the probe tip (16) and the surface treatment (19). The surface treatment is used to create sharp pointed projections on the tip of the probe (16) that facilitate penetration of the thin oxide (33) on the contact terminals (31) of the IC device (30). A thin layer of gold is plated over the surface treatment to minimize the contact resistance of the probe interface.

Figure 3:
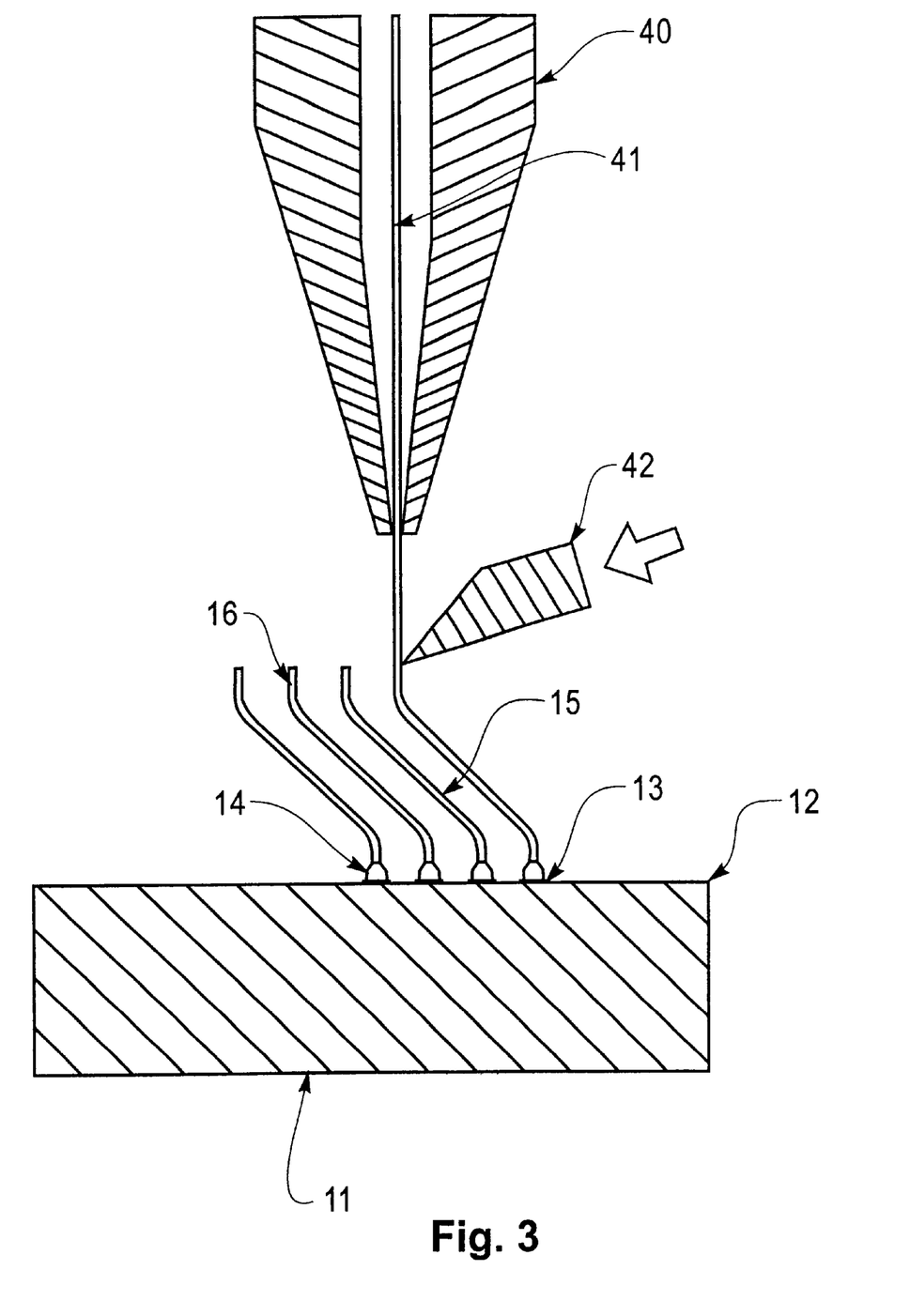
FIGS. 3–6 show the processes used to fabricate the high density probe on a fan out wiring substrate.

FIG. 3 shows the first process used to fabricate the high density probe. A thermosonic wire bonder tool is used to attach ball bonds (14) to the fan out wiring (13) on the first surface (12) of the rigid substrate (11). The wire bonder tool uses a first ceramic capillary (30) to press the ball shaped end of the bond wire (31) against the first surface (12) of the substrate (11). Compression force and ultrasonic energy are applied through the first capillary (30) tip and thermal energy is applied from the wire bonder stage through the substrate (11) to bond the ball shaped end of the bond wire (31) to the fan out wiring (13) on the first surface (12) of the substrate (11). The bond wire (31) is positioned at an angle and a shear blade (32) is used to sever the bond wire (31) to create an angled segment of wire (15) protruding vertically from the ball bond (14).

Figure 4:
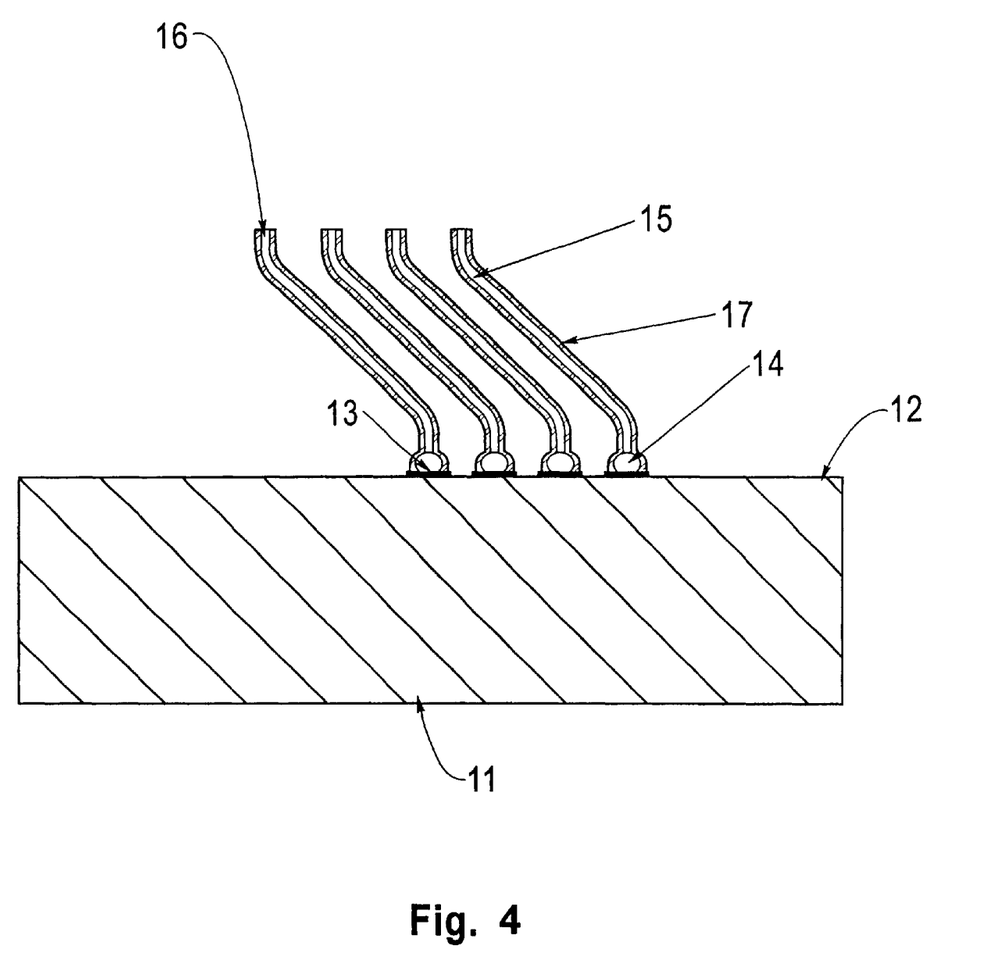

FIG. 4 shows the high density probes after completion of the plating process. The probe wires (15) can be plated using conventional electroplating, electroless plating, sputtering, or evaporation techniques. Since the modulus of elasticity of the probe structure is a result of the combined probe wire (15) diameter and plating material (17) thickness, a uniform thickness of the plated material (17) is necessary to provide uniform elastic properties for each of the probe wires (15) in the array. Various materials can be used for plating the probe wires (15) including nickel, copper, palladium, and platinum as well as alloys such as palladium-nickel and nickel-iron. The plating layer (17) can be formed as a single layer or as multiple layers of the same material or as multiple layers of different materials. A thin layer of gold or other noble metal is typically used as the outer layer of the plating (17) to minimize the contact resistance of the probe interface. The total thickness of the plating layer (17) can vary from 5 to 127 microns.

Figure 5:
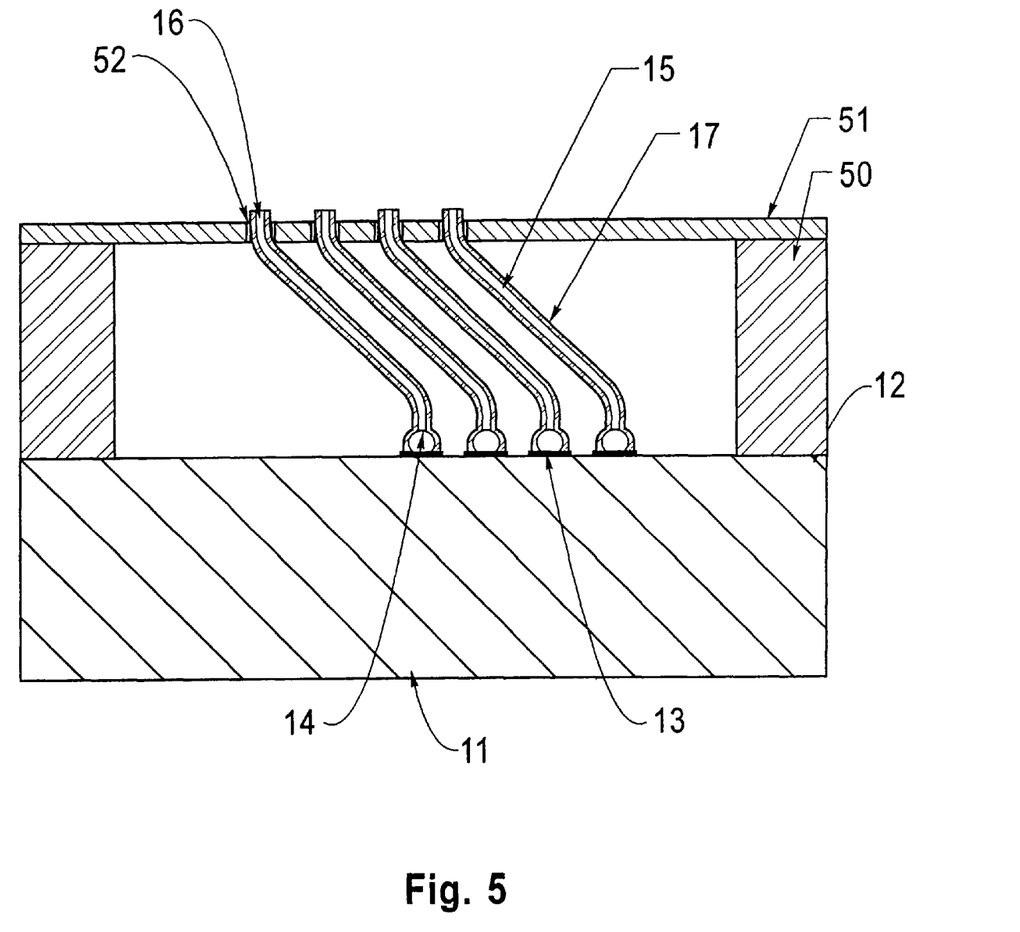

FIG. 5 shows the high density probe after attachment of the alignment mask (51) and the support frame (50). The thermal coefficient of expansion (TCE) of the alignment mask (51) and the support frame (50) can be selected to match the TCE of the IC device or other substrate material of the device to be allow high temperature testing with the probe structure.

Figure 6:
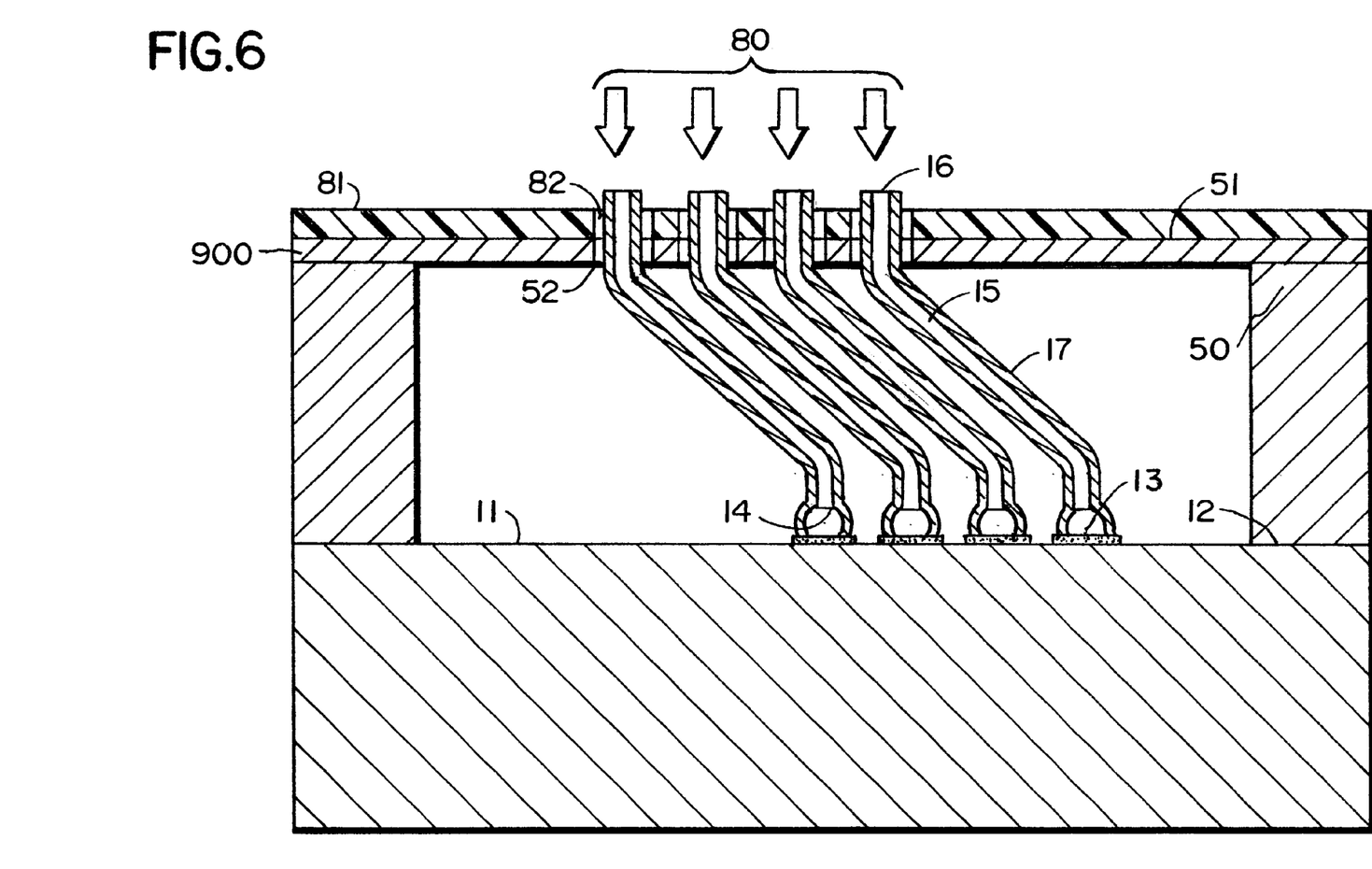

FIG. 6 shows a process used for surface treatment (19) of the probe tips (16). The process shown in FIG. 6 uses a flame spraying technique (80) to coat the tips of the probes (16) with tiny ceramic particles. A protective mask (81) with the corresponding holes (82) is placed over the ends of the probes (16) protruding through the alignment mask (51). The alignment mask layer (51) consists of two layers: a 1st electrically conductive layer (900) and second dielectric layer (81). The alignment mask layer (51) is designed and selected to closely match the thermal coefficient of expansion (TCE) between the probes and the silicon wafer at elevated temperature during probing. The $1^{st}$ electrically conductive layer (900) is made of Invar which has low coefficient of thermal expansion (TCE) and is made of 36 wt % Ni and 64 wt % to have a thermal expansion coefficient of 2.2 ppm/° C. The combination of the $1^{st}$ layer (900) and $2^{nd}$ dielectic layer (81) with a thickness ratio of approximately 6:2 offers a TCE of 3 ppm/° C. which matches the CTE of silicon wafer precisely. The flame spraying technique heats the tiny ceramic particles which causes them to fuse to the ends of the probe wires (16). The surface treatment (19) is used to create multiple small pointed projections on the ends of the probes (16). If the surface treatment material (such as ceramic) is non-conductive or has high resistance, a thin gold (or other noble metal) can be plated over the surface treatment to minimize the contact resistance of the probe interface.

FIG. 6 shows a process used for surface treatment (19) of the probe tips (16). The process shown in FIG. 6 uses a flame spraying technique (80) to coat the tips of the probes (16) with tiny ceramic particles. A protective mask (81) with corresponding holes (82) is placed over the ends of the probes (16) protruding through the alignment mask (51). The flame spraying technique heats the tiny ceramic particles which causes them to fuse to the ends of the probe wires (16). The surface treatment (19) is used to create multiple small pointed projections on the ends of the probes (16). If the surface treatment material (such as ceramic) is non-conductive or has high resistance, a thin gold (or other noble metal) can be plated over the surface treatment to minimize the contact resistance of the probe interface.

Alternate Embodiments

Figure 7:
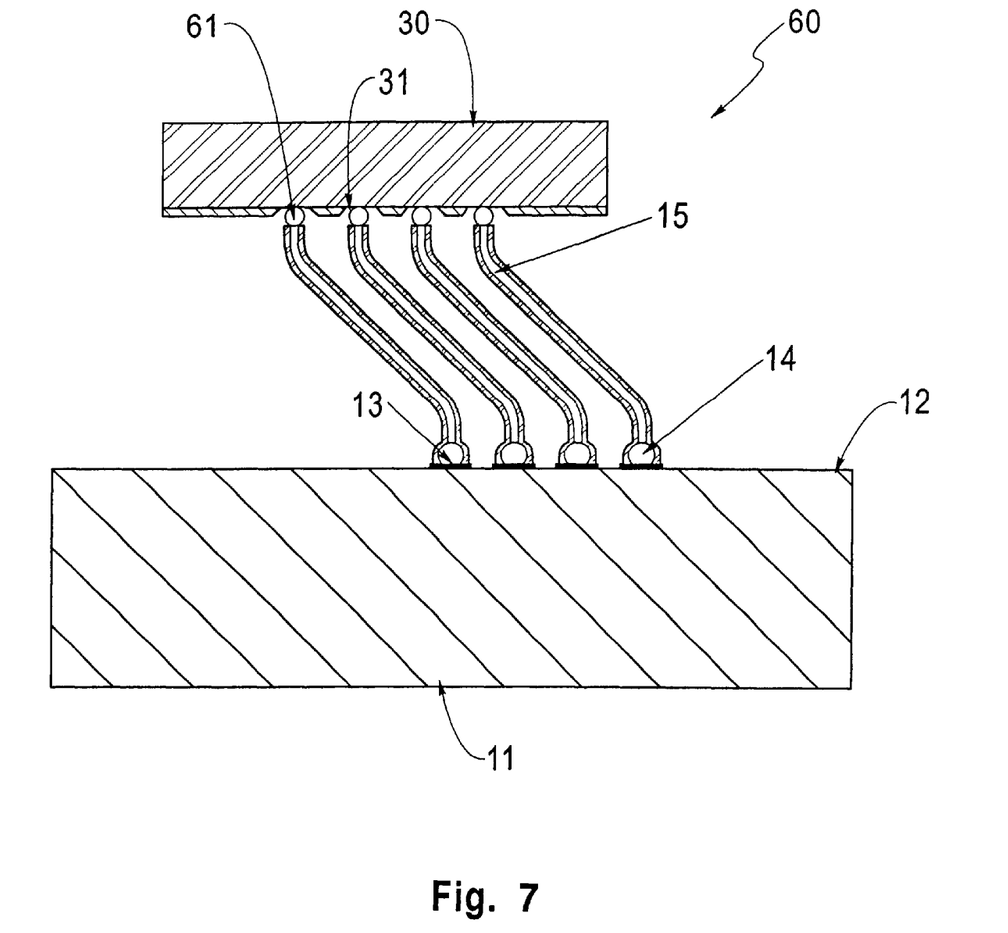
FIG. 7 shows a first alternate embodiment of the high density probe.

FIG. 7 shows an alternate embodiment of the high density probe (60) using a ball shaped contact (61) on the end of the probe wire (15). The ball shaped contacts (61) are created using a laser process the melts the ends of the probe wires (16). The ball shaped contact (61) is useful for creating a wiping contact interface with the mating contact surface (31) on the IC device (30). The probe structure (60) is shown without the alignment mask (51) used in the preferred embodiment (10) to allow the probe wires to deflect in the X, Y, and Z directions. Slotted holes in the alignment mask (51) would allow limited movement in the X direction for contact wipe and limited movement in the Z direction to prevent plastic deformation of the probe wires (15).

Figure 8:
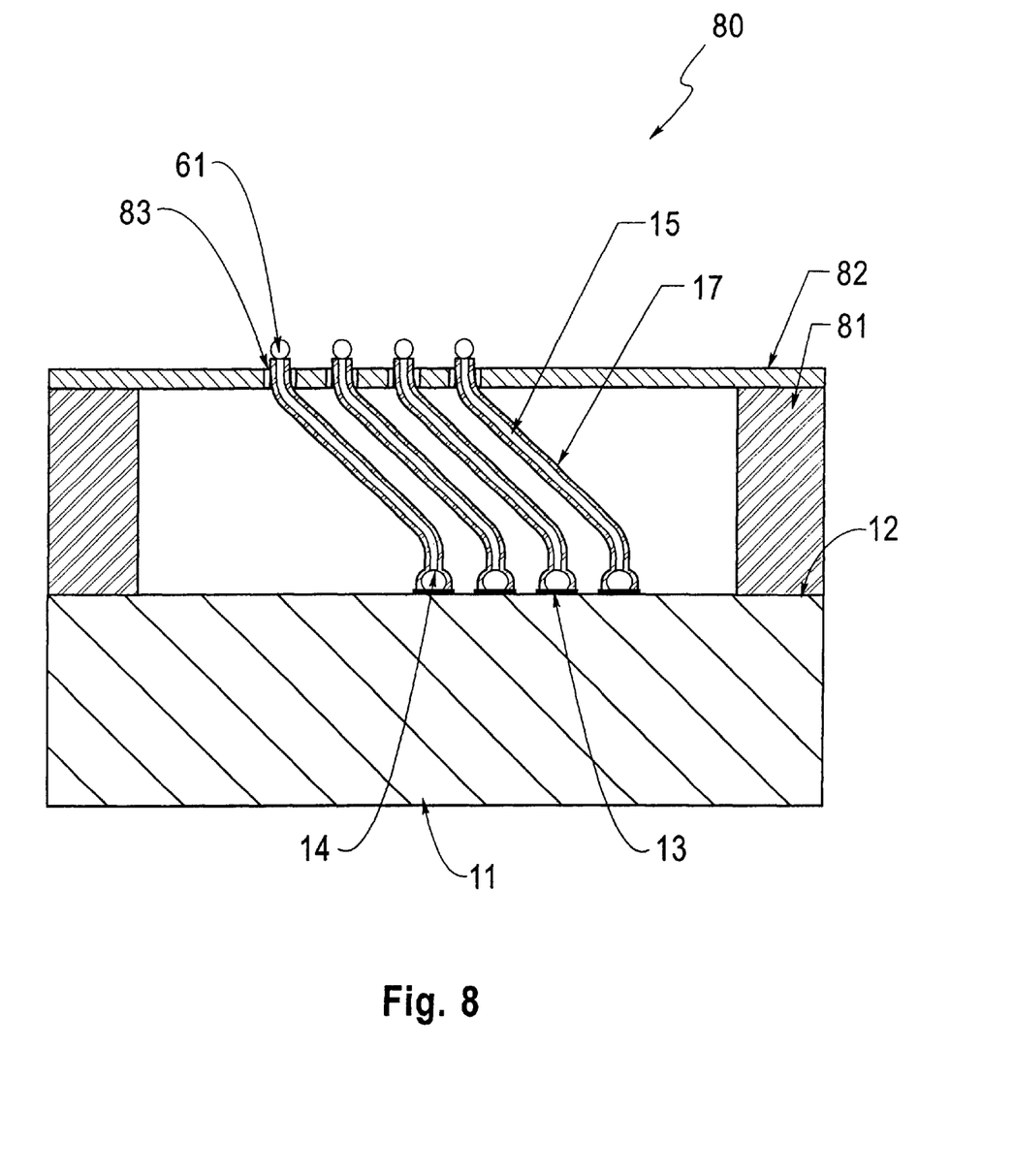
FIG. 8 shows a second alternate embodiment of the high density probe.

FIG. 8 shows a second alternate embodiment of the high density probe (80) that is similar to the first alternative embodiment (60). The second alternate embodiment (80) uses a ball shaped contact (61) on the end of the probe wire (15) along with an alignment mask (82) and support frame (81). The alignment mask (82) limits the movement of the ball shaped contact (61) in the X and Y directions by the size of the holes (83) in the alignment mask (82). Movement of the ball shaped contact (61) in the Z direction is limited by the length of the probe wire (15) protruding through the alignment mask (82). The height of the alignment mask (82) above the first surface (12) of the substrate (11) is controlled by the thickness of the support frame (81).

Figure 9:
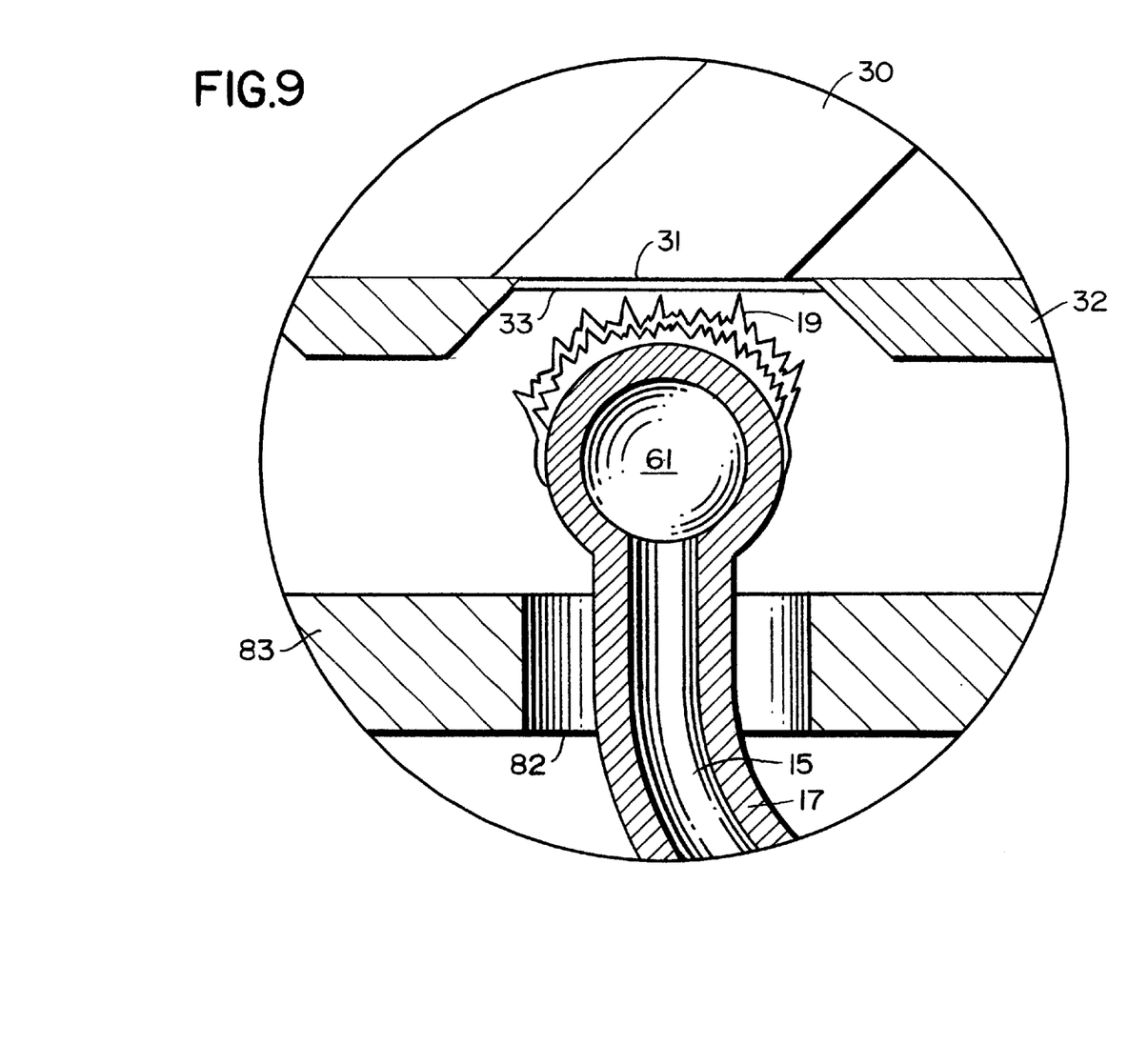
FIG. 9 shows a magnified view of the probe tip of the second alternate embodiment of the high density probe.

FIG. 9 shows a magnified view of the second alternate embodiment of the high density probe (80). The magnified view shows the surface treatment (84) on the ball shaped contact (61). The surface treatment is used to create sharp pointed projections on the ball shaped contact (61) that facilitate penetration of the thin oxide (33) on the contact terminals (31) of the IC device (30). A thin layer of gold is plated over the surface treatment to minimize the contact resistance of the probe interface.

Figure 10:
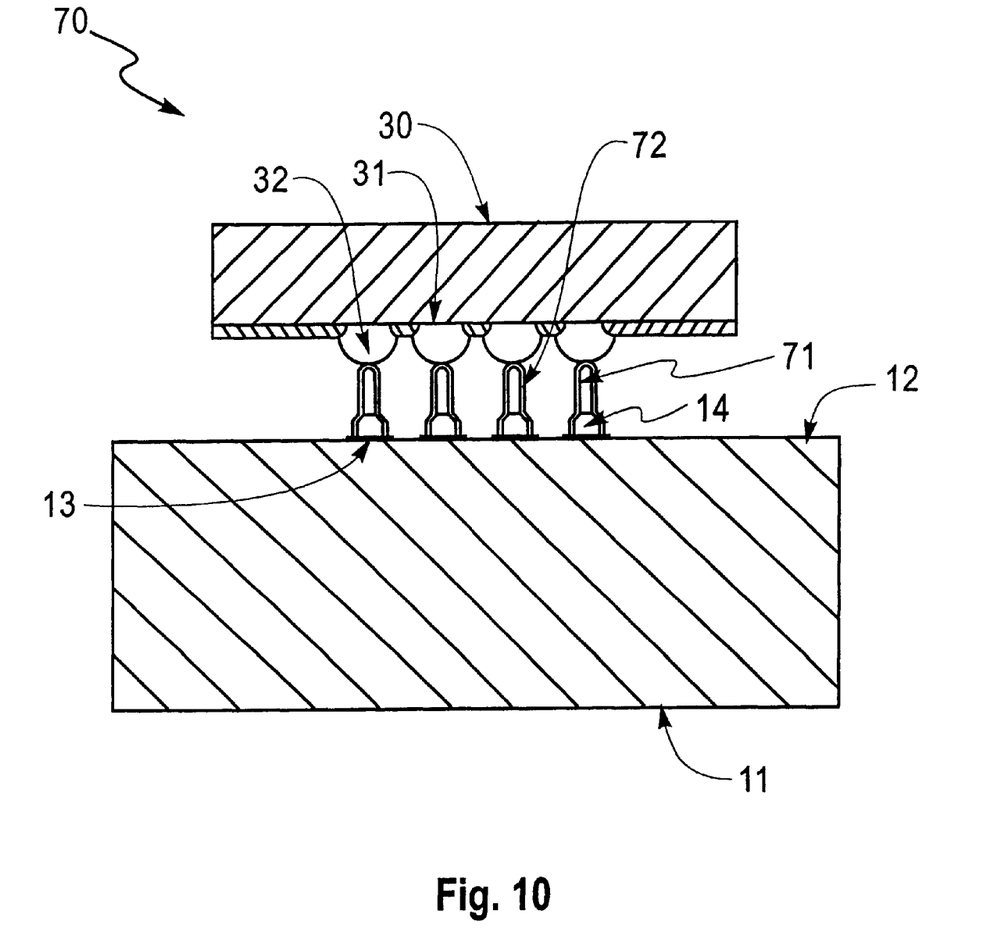
FIG. 10 shows a third alternate embodiment of the high density probe.

FIG. 10 shows an alternate embodiment of the high density probe (70) used for testing IC devices (31) with solder balls (32) on the IC terminals (31). The short stud (71) extending from the ball bond (14) is plated with a hard material (72) to prevent X-Y deflection of the probe (70) during testing.

Figure 11:
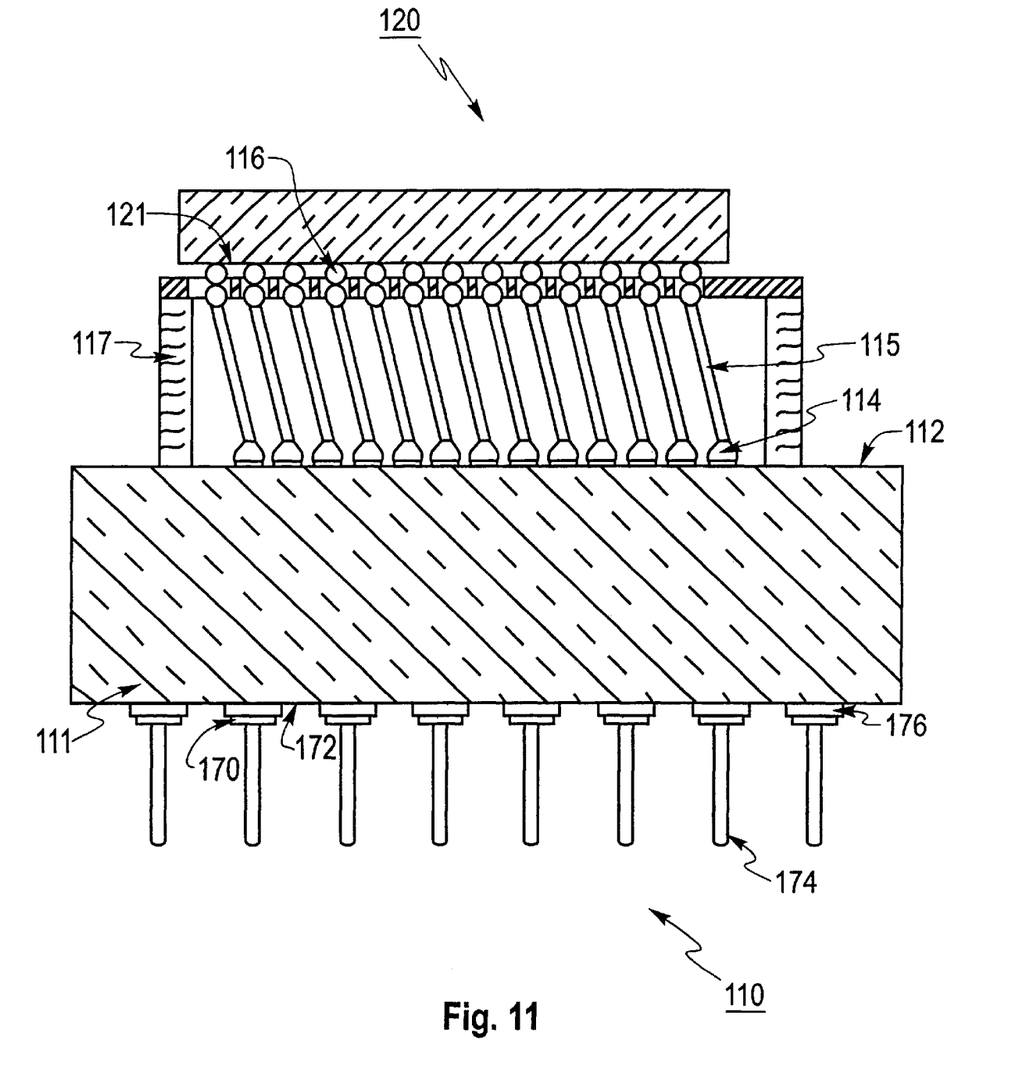
FIG. 11 shows the structure of FIG. 1 with conductive pins at the contact locations on the second surface.

FIG. 11 shows the structure of FIG. 1 with second contact locations (170) (70) on surface (172) of substrate (110). Contact locations (172) can be the same as contact locations (113). FIG. 11 shows the structure of FIG. 1 with elongated conductors (174) such as pins fixed to the surface (176) of pad (170).

Figure 12:
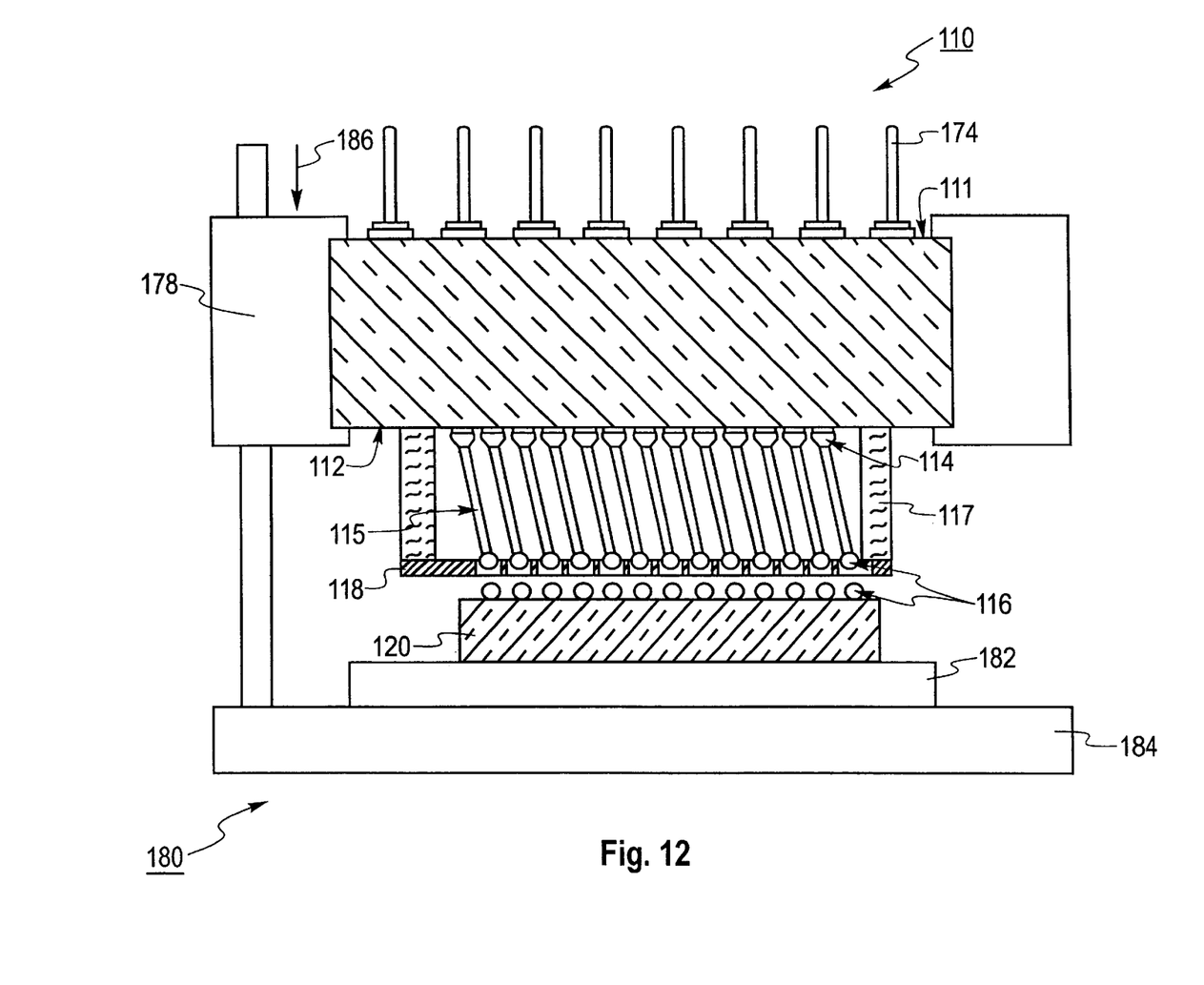
FIG. 12 schematically shows the structure of FIG. 11 in combination with a means for moving the probe into engagement with a device under test.

FIG. 12 shows substrate (110) held by arm (178) of fixture (180). Work piece (120) is disposed on support (182) which is disposed in contact with fixture (180) by base (184). Arm (178) is adapted for movement as indicated by arrow (186) towards base (184), so that probe tips (112) are brought into engagement with conductors (122). An example of an apparatus providing a means for moving substrate (110) into engagement with work piece (20) can be found in U.S. Pat. No. 4,875,614.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A probe structure comprising:
   a substrate having a substrate surface having a plurality of substrate electrical contact locations;
   a plurality of elongated electrical conductors; having a first and second end;
   said first end of each of said plurality of elongated electrical conductors is electrically connected to one of said plurality of substrate electrical contact locations;
   a plate having a first and second side, and having a plurality of openings therein extending from said first side to said second side;
   said plate is disposed so that said first side thereof faces said substrate;
   said second end of each of said plurality of elongated electrical conductors extends through one of said openings in said plate;
   an elastomeric ring support for maintaining said plate at a distance from said substrate surface;
   said distance is selected so that said second ends project out from said second side of said plate a sufficient amount so that when said probe structure is pressed against a device under test, said second ends of said elongated electrical conductors are maintained within a displaced distance from an original position by said opening so that said second ends of said elongated electrical conductors remain in contact with an electrical contact location on said device under test.

2. A probe structure according to claim 1 wherein each of said second ends of said elongated electrical conductors has multiple small pointed projections thereat.

3. A probe structure according to claim 1 wherein said support is at the periphery of said plate.

4. A probe structure according to claim 1 wherein said plate is electrically conductive.

5. A probe structure according to claim 1 wherein aid second ends have a ball shape with a coating of multiple small pointed projections thereon.

6. A probe structure according to claim 1 wherein:
   said second ends have a plurality of multiple small projections therat.

7. A probe structure according to claim 6, wherein said plurality of multiple small projections are plated.

8. A probe structure according to claim 7 further including a plated electrically conductive coating in said elongated electrical conductors.

* * * * *